(12) United States Patent
Park et al.

(10) Patent No.: US 6,511,890 B2
(45) Date of Patent: *Jan. 28, 2003

(54) METHOD OF FABRICATING A SEMICONDUCTOR DEVICE

(75) Inventors: Sung-Kye Park, Chungcheongbuk-do (KR); Young-Chul Lee, Chungcheongbuk-do (KR)

(73) Assignee: Hyundai MicroElectronics Co., Ltd., Chungcheongbuk-do (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/421,090

(22) Filed: Oct. 19, 1999

(65) Prior Publication Data

US 2002/0127809 A1 Sep. 12, 2002

(30) Foreign Application Priority Data

Jul. 9, 1999 (KR) .......................................... 99-27722

(51) Int. Cl.$^7$ ............................................. H01L 21/331
(52) U.S. Cl. ........................ 438/359; 438/301; 438/306
(58) Field of Search ................................. 438/359, 301, 438/306

(56) References Cited

U.S. PATENT DOCUMENTS 5,801,082 A      9/1998  Tseng ........................ 438/424
6,008,540 A  *  12/1999  Lu et al. ..................... 257/758

OTHER PUBLICATIONS

Wolf et al., *Silicon Processing For The VLSI Era*, vol. 2, Lattice Press, 1990, pp. 194–199.*

* cited by examiner

*Primary Examiner*—John F. Niebling
*Assistant Examiner*—Lynne A. Gurley
(74) *Attorney, Agent, or Firm*—Morgan, Lewis & Bockius LLP

(57) ABSTRACT

The present invention related to a method of fabricating a semiconductor device which prevents short channel hump due to the moisture in an insulating interlayer. The present invention includes the steps of forming a trench typed field oxide layer defining an active area in a field area of a semiconductor substrate of a first conductive type, forming a gate to the direction of device width wherein a gate oxide layer is inserted between the gate and semiconductor substrate, forming impurity regions in the semiconductor substrate at both sides of the gate by ion implantation with impurities of a second conductive type, forming an insulating interlayer covering the gate on the semiconductor substrate, and removing moisture contained in the insulating interlayer by thermal treatment.

14 Claims, 7 Drawing Sheets

수분

METHOD OF FABRICATING A SEMICONDUCTOR DEVICE

BACKGROUND OF THE INVENTION

1. Field of Invention

The present invention related to a method of fabricating a semiconductor device which prevents short channel hump due to the moisture in an insulating interlayer.

2. Discussion of Related Art

As semiconductor devices are highly integrated, techniques of reducing the device isolating area which is so-called field area occupying relatively large area in a semiconductor device have been developed so far.

In a general method of fabricating semiconductor devices, devices are isolated by local oxidation of silicon(hereinafter abbreviated LOCOS) which oxidizes a field area of a semiconductor substrate thermally. Bird's beaks are formed, when LOCOS is carried out, as oxygens are diffused to the horizontal direction along with a buffer oxide layer. Therefore, active layers are reduced in size to increase device sizes. That's why various methods of reducing bird's beak size as well as isolating devices have been developed.

Shallow trench isolation(hereinafter abbreviated STI), which forms a field oxide layer by forming a trench in a field area of a semiconductor substrate and by filling up the trench with insulating substance to isolated devices, is very useful for reducing a chip size and planarizing a surface of the substrate.

FIG. 1A to FIG. 1E show a method of fabricating a semiconductor device according to a related art.

Referring to FIG. 1A, a buffer oxide 13 is formed on a p typed semiconductor substrate 11 by thermal oxidation. A mask layer 15 is formed by depositing silicon nitride on the buffer oxide layer 13 by chemical vapor deposition (hereinafter abbreviated CVD).

A device isolating area and an active area are defined by patterning the mask and buffer oxide layers 15 and 13 selectively to expose a surface of the semiconductor substrate 11 by photolithography. Then, trenches 17 are formed by etching the exposed surface of the semiconductor substrate 11 by anisotropic etch such as reactive ion etching (hereinafter abbreviated RIE) or plasma etch.

Referring to FIG. 1b, silicon oxide is deposited on the mask layer 15 to fill up the trenches 17 by CVD. And, silicon oxide is etched back to expose the mask layer 15 only to remain inside the trenches 17 by chemical mechanical polishing(hereinafter abbreviated CMP) or RIE. In this case, the silicon oxide just remaining inside the trenches 17 becomes a field oxide layer 19 isolating devices.

An active area of the semiconductor substrate 11 is exposed by removing the mask and pad oxide layers 15 and 13 successively by wet etch. In this case, step difference is reduces as the portion of the field oxide layer 19 which is higher than the surface of the substrate 11 is etched away.

Referring to FIG. 1C, a gate 23 is formed by inserting a gate oxide layer 21 in the active area on the semiconductor substrate 11. The gate oxide layer 21 is formed by oxidizing a surface of the semiconductor substrate 11. The gate 23 is formed by depositing polysilicon doped with impurities on the gate oxide layer 21 by CVD then by patterning the polysilicon to expose the semiconductor substrate 11 by photolithography. In this case, the gate 23 is patterned to the direction of the width of a device, which is perpendicular to the length direction of the device as well as the cross section, overlapped with a predetermined portion of the field oxide layer 19.

Lightly doped regions 25 used as an LDD(lightly doped drain) region are formed by implanting n typed impurities with low dose and energy into the semiconductor substrate 11 in use of the gate 23 as a mask.

Referring to FIG. 1D, insulator such as silicon oxide and the like is deposited on the semiconductor substrate 11 to cover the gate 23 by CVD. And, a sidewall spacer 27 is formed at the lateral sides of the gate 23 by etching back the insulator to expose the semiconductor substrate 11.

Heavily doped regions 29 used for source and drain regions overlapped with the lightly doped regions 25 are formed by implanting n typed impurity ions into the semiconductor substrate 11 with heavy dose and energy in use of the gate 23 and sidewall spacer 27 as a mask. In this case, the portion of the semiconductor substrate 11, which is free from being implanted with impurities, under the gate 23 becomes a channel region of a device.

Referring to FIG. 1E, an insulating interlayer 31 covering the gate 23 and sidewall spacer 27 is formed on the semiconductor substrate 11. In this case, the insulating interlayer 31 is formed to improve the planarization of the surface by depositing TEOS(Tetraethyl orthosilicate) by LPCVD(Low Pressure CVD) or PECVD(Plasma Enhanced CVD).

An etch-stop layer 33 is formed by depositing silicon nitride on the insulating interlayer 31 by CVD. A contact hole 35 exposing the heavily doped region 29 is formed by patterning the etch-stop layer 33 and insulating interlayer 31 by photolithography.

In the contact hole 35, a plug connecting a capacitor to the heavily doped region 29 will be formed. The etch-stop layer 33 prevents the insulating interlayer 31 from being etched when polysilicon is patterned to form capacitor electrodes.

As mentioned in the above explanation of the method of fabricating a semiconductor device, planarization of the surface is improved as the insulating interlayer is formed by depositing TEOS by PECVD or LPCVD.

Unfortunately, as LPCVD or PECVD for depositing TEOS is carried out at low temperature, moisture having less evaporating tendency remains inside when the insulating interlayer is formed. Therefore, the moisture fails to diffuse outside but diffuse downward when the etch-stop layer is formed and treated thermally. And, the moisture diffuses into the corners of the gate through the interface between the semiconductor substrate and field oxide, generating positive fixed charge. Thus, stand-by current is increased as breakdown voltage in the lightly doped regions to the direction of device width of an NMOS transistor is lowered.

SUMMARY OF THE INVENTION

Accordingly, the present invention is directed to a method of fabricating a semiconductor device that substantially obviate one or more of the problems due to limitations and disadvantages of the related art.

The object of the present invention is to provide a method of fabricating a semiconductor device which prevents stand-by current from increasing due to the breakdown voltage drop in the lightly doped region to the direction of device width.

Additional features and advantages of the invention will be set forth in the description which follows and in part will be apparent from the description, or may be learned by practice of the invention.

The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes the steps of forming a trench typed field oxide layer defining an active area in a field area of a semiconductor substrate of a first conductive type, forming a gate to the direction of device width wherein a gate oxide layer is inserted between the gate and semiconductor substrate, forming impurity regions in the semiconductor substrate at both sides of the gate by ion implantation with impurities of a second conductive type, forming an insulating interlayer covering the gate on the semiconductor substrate, and removing moisture contained in the insulating interlayer by thermal treatment.

In another aspect, the present invention includes the steps of forming a trench defining an active area on the field area in a semiconductor substrate of a first conductive type, forming a field oxide layer in the trench, forming a gate oxide layer and an electrically-conductive layer, forming a gate long to the direction of device width on the field and active areas by patterning the electrically-conductive and gate oxide layers, forming lightly doped regions by implanting impurity ions of a second conductive type into the semiconductor substrate in use of the gate as a mask, forming a sidewall spacer at the side of the gate, forming heavily doped regions by implanting the impurity ions of the second conductive type into the semiconductor substrate in use of the gate and sidewall spacer as a mask with predetermined dose and energy which is higher than used for forming the lightly doped regions, forming an insulating interlayer covering the gate on the semiconductor substrate, removing moisture contained in the insulating interlayer by thermal treatment, forming an etch-stop layer on the insulating interlayer with insulator of which etch rate is different that of the insulating interlayer, and forming a contact hole exposing the impurity regions by patterning the etch-stop layer and insulating interlayer.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention.

DETAILED DESCRIPTION OF PREFERRED EMBODIMENTS

Reference will now be made in detail to the preferred embodiments of the present invention, examples of which are illustrated in the accompanying drawings.

FIG. 2A to FIG. 2F show a method of fabricating a semiconductor device according to the present invention.

Figure 1A:
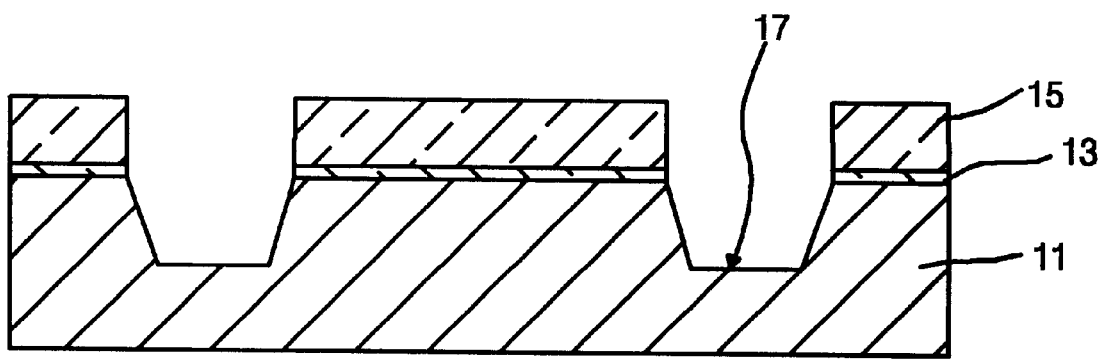
FIG. 1A to FIG. 1E show a method of fabricating a semiconductor device according to a related art.
Figure 1B:
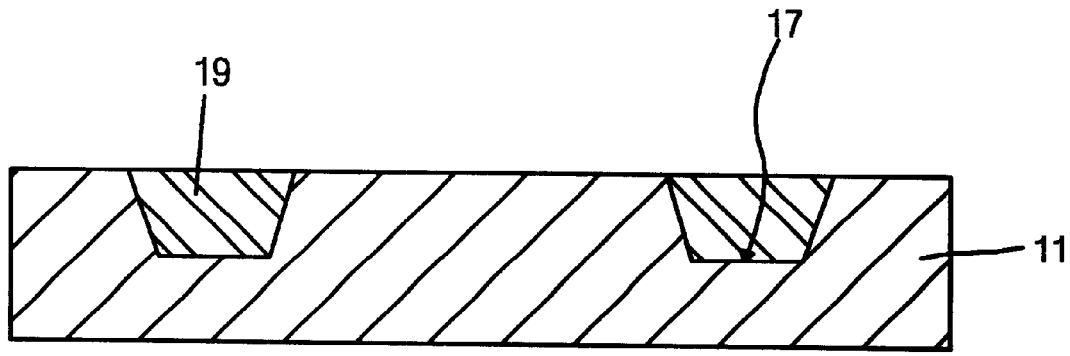
Figure 1C:
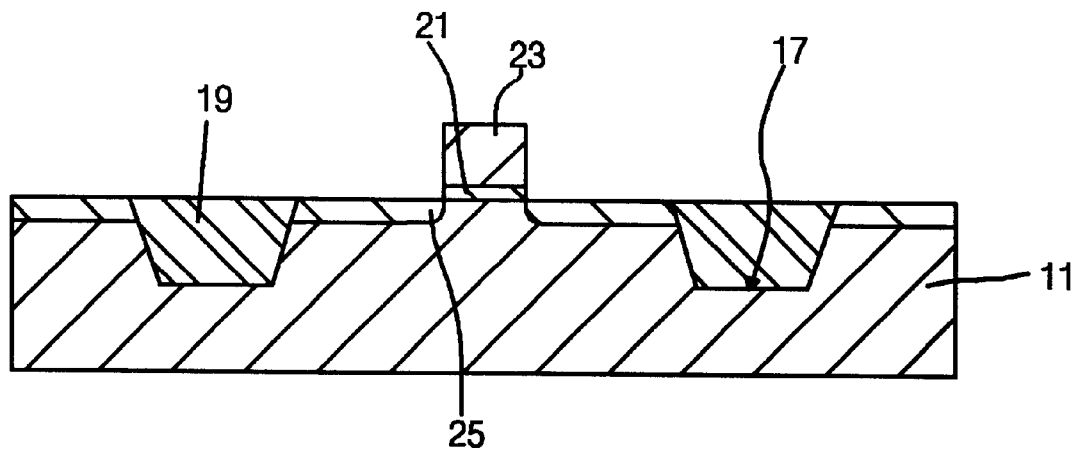
Figure 1D:
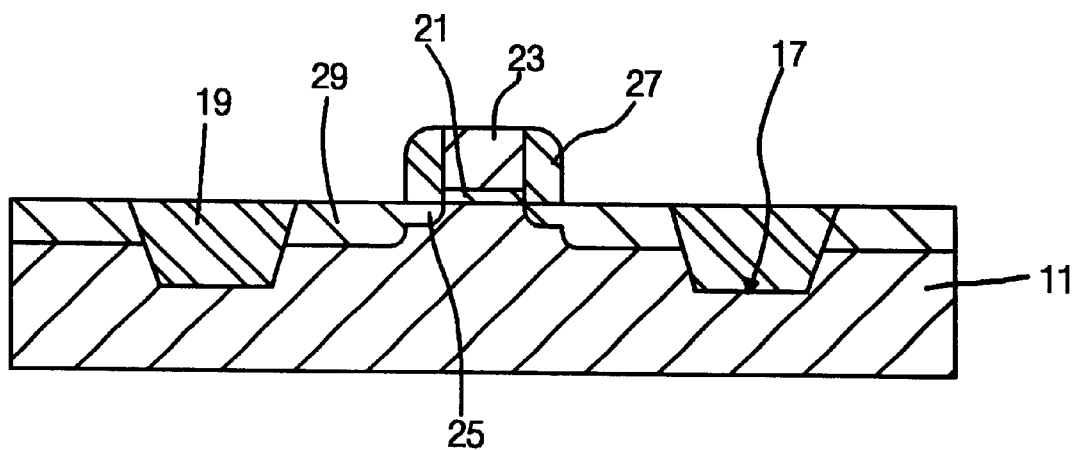
Figure 1E:
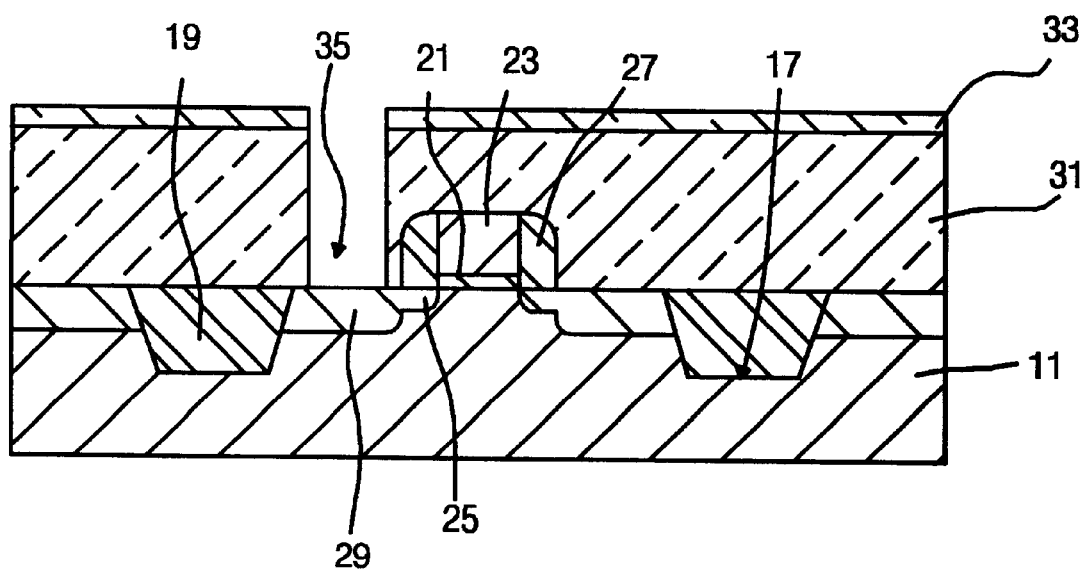
Figure 2A:
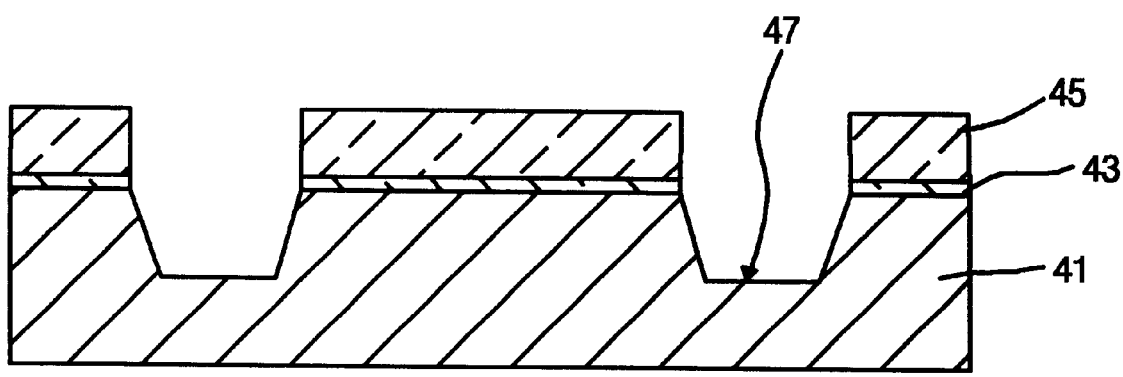
FIG. 2A to FIG. 2F show a method of fabricating a semiconductor device according to the present invention.

Referring to FIG. 2A, a buffer oxide 43 is formed on a p typed semiconductor substrate 41 by thermal oxidation. A mask layer 45 is formed by depositing silicon nitride on the buffer oxide layer 43 by chemical vapor deposition (hereinafter abbreviated CVD).

A device isolating area and an active area are defined by patterning the mask and buffer oxide layers 45 and 43 selectively to expose a surface of the semiconductor substrate 41 by photolithography. Then, trenches 47 are formed by etching the exposed surface of the semiconductor substrate 41 by anisotropic etch such as reactive ion etching (hereinafter abbreviated RIE) or plasma etch.

Figure 2B:
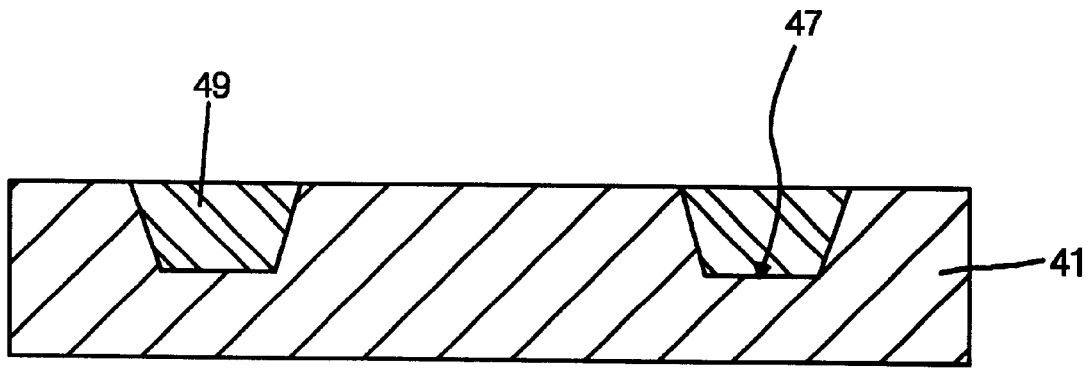

Referring to FIG. 2b, silicon oxide is deposited on the mask layer 45 to fill up the trenches 47 by CVD. And, silicon oxide is etched back to expose the mask layer 45 only to remain inside the trenches 47 by chemical mechanical polishing(hereinafter abbreviated CMP) or RIE. In this case, the silicon oxide just remaining inside the trenches 47 becomes a field oxide layer 49 isolating devices.

An active area of the semiconductor substrate 41 is exposed by removing the mask and pad oxide layers 45 and 43 successively by wet etch. In this case, step difference is reduces as the portion of the field oxide layer 49 which is higher than the surface of the substrate 41 is etched away.

Figure 2C:
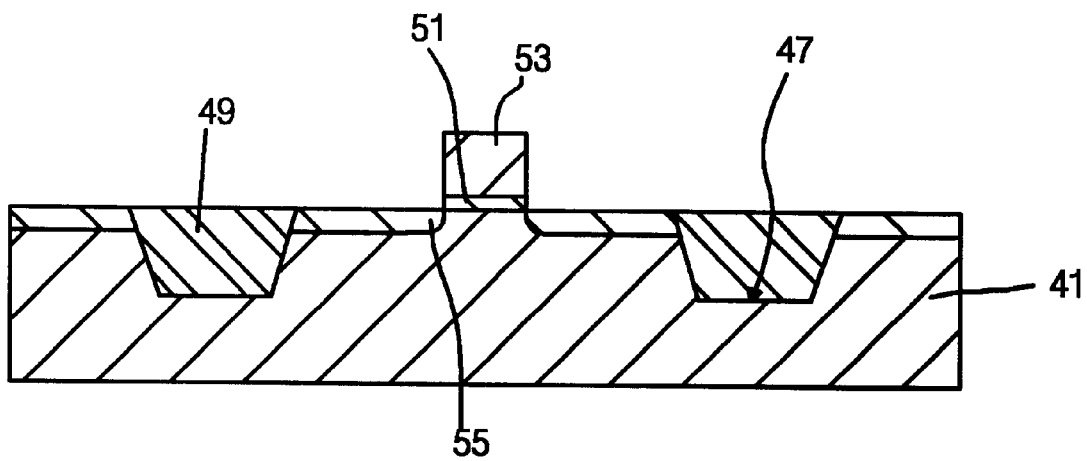

Referring to FIG. 2C, a gate 53 is formed by inserting a gate oxide layer 51 in the active area on the semiconductor substrate 41. The gate oxide layer 51 50 to 150 Å thick is formed by oxidizing a surface of the semiconductor substrate 41. The gate 53 is formed by depositing polysilicon doped with impurities on the gate oxide layer 51 by CVD then by patterning the polysilicon to expose the semiconductor substrate 41 by photolithography. In this case, the gate 53 is patterned to the direction of the width of a device, which is perpendicular to the length direction of the device as well as the cross section, overlapped with a predetermined portion of the field oxide layer 49.

Lightly doped regions 55 used as an LDD(lightly doped drain) region are formed by implanting n typed impurities with low dose and energy into the semiconductor substrate 41 in use of the gate 53 as a mask.

Figure 2D:
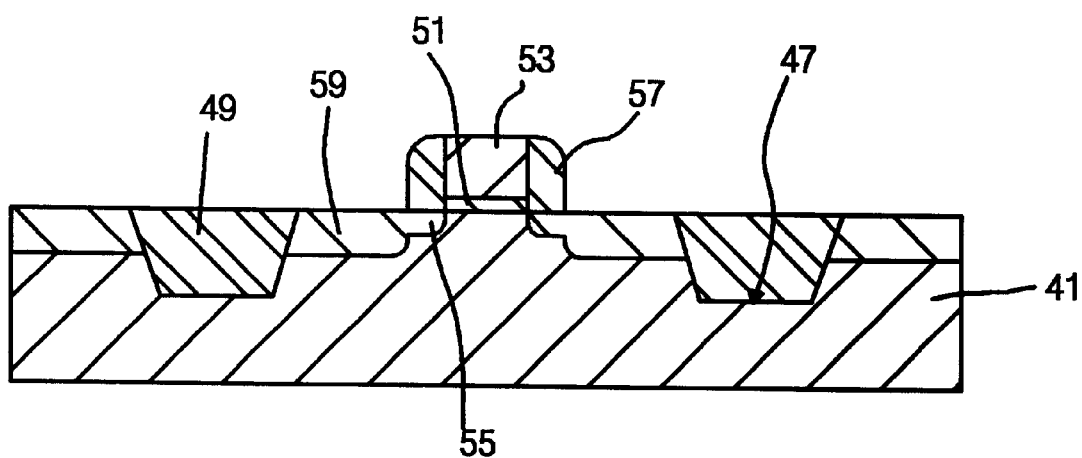

Referring to FIG. 2D, insulator such as silicon oxide, silicon nitride and the like is deposited on the semiconductor substrate 41 to cover the gate 53 by CVD. And, a sidewall spacer 57 is formed at the lateral sides of the gate 53 by etching back the insulator to expose the semiconductor substrate 41. Heavily doped regions 59 used for source and drain regions overlapped with the lightly doped regions 55 are formed by implanting n typed impurity ions into the semiconductor substrate 41 with dose and energy heavier than those of the lightly doped regions 55 in use of the gate 53 and sidewall spacer 57 as a mask. In this case, the portion of the semiconductor substrate 41, which is free from being implanted with impurities, under the gate 53 becomes a channel region of a device.

Figure 2E:
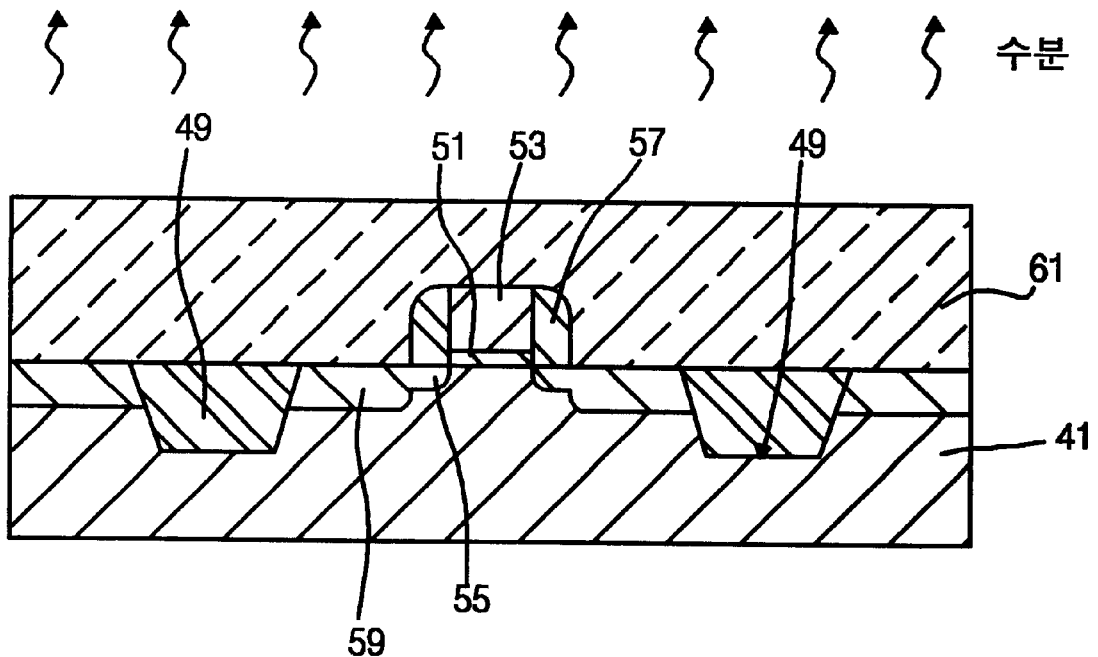

Referring to FIG. 2E, an insulating interlayer 61 covering the gate 53 and sidewall spacer 57 is formed on the semiconductor substrate 41. In this case, the insulating interlayer 61 6000 to 10000 Å thick is formed at the low temperature between 650 and 700° C. to improve the planarization of the surface by depositing TEOS(Tetraethyl orthosilicate) by LPCVD(Low Pressure CVD) or PECVD(Plasma Enhanced CVD). In this case, as the insulating interlayer 61 is formed at low temperature, moisture having less evaporating tendency remains inside.

After the formation of the insulating interlayer 61, moisture contained inside the insulating interlayer 61 is diffused outside by carrying out vacuum annealing for 30 minutes to 5 hours at 700 to 800° C. or rapid thermal process for 10 to 60 seconds at 900 to 1000° C..

Figure 2F:
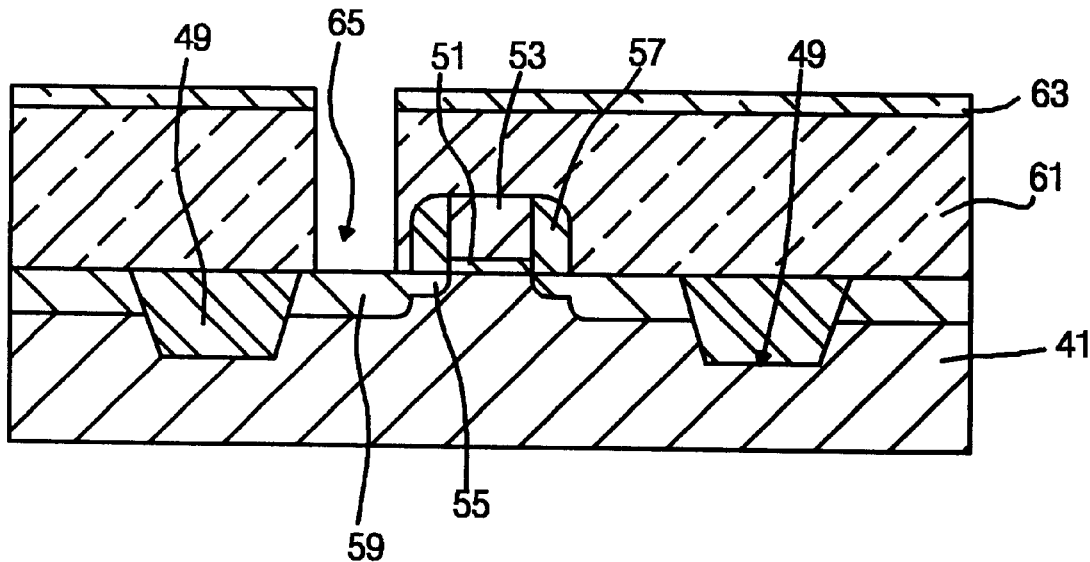

Referring to FIG. 2F, an etch-stop layer 63 is formed by depositing silicon nitride on the insulating interlayer 61 by CVD. Being diffused outside the insulating interlayer 61 before the formation of the etch-stop layer 63, the moisture is prevented from diffusing into the corners of the gate 53 through the interface between the semiconductor substrate 41 and field oxide layer 49. As positive fixed charges are removed at the corners of the gate 53, stand-by current which ruins device characteristics is prevented from increasing because breakdown voltage at the lightly doped regions 55 to the direction of device width of an n typed MOS transistor is lowered.

A contact hole 65 exposing the heavily doped region 59 is formed by patterning the etch-stop layer 63 and insulating interlayer 61 by photolithography.

In the contact hole 65, a plug connecting a capacitor to the heavily doped region 59 will be formed. The etch-stop layer 63 prevents the insulating interlayer 61 from being etched when polysilicon is patterned to form capacitor electrodes.

Figure 3:
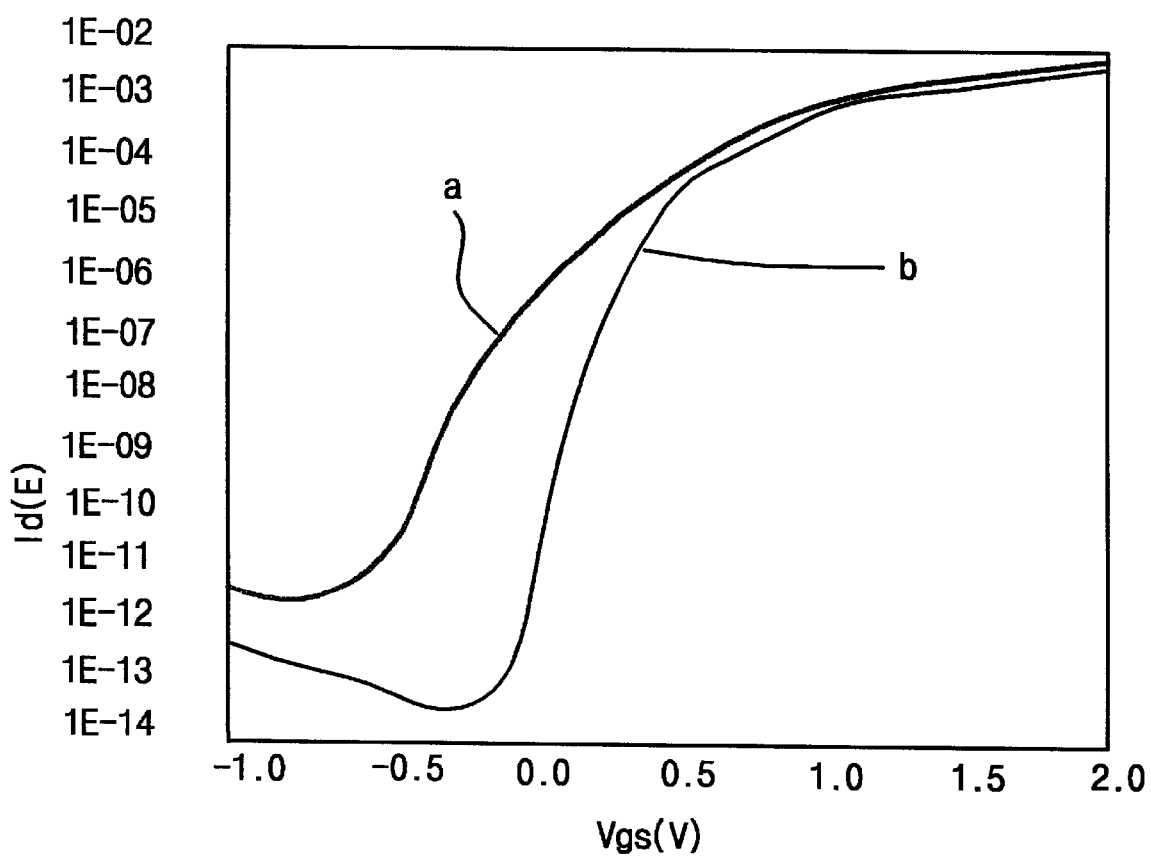
FIG. 3 shows current/voltage(Id/Vgs) characteristics of semiconductor devices fabricated by the present invention and related art.

FIG. 3 shows current/voltage(Id/Vgs) characteristics of semiconductor devices fabricated by the present invention and related art.

Referring to FIG. 3, a curve A indicates current/voltage characteristics of a semiconductor device fabricated by the related art, while a curve B does those by the present invention.

In view of the curve A, when the semiconductor device of the related art stands by as soon as voltage Vgs between a gate and source is supplied with 0V, drain current Id becomes about 10-7A. When the device is at the mode of normal operation as soon as voltage Vgs between the gate and source is supplied with 0.7V, the device is turned on as the drain current becomes about 10-4A.

However, in view of the curve B, when the semiconductor device of the present invention is at the mode of stand-by as soon as voltage Vgs between a gate and source is supplied with 0V, drain current Id becomes about 10-11A. When the device is at the mode of normal operation as soon as voltage Vgs between the gate and source is supplied with 0.7V, the device is turned on as the drain current Id becomes about 10-4A.

In the above explanation, compared to the semiconductor device of the related art, the semiconductor device fabricated by the present invention shows that the drain current Id decreases 10-7A to 10-11A at the mode of stand-by but indicates 10-4A changing little at the mode of normal operation.

In the present invention, being diffused outside the insulating interlayer before the formation of the etch-stop layer, the moisture is prevented from diffusing into the corners of the gate through the interface between the semiconductor substrate and field oxide layer by vacuum annealing or rapid thermal process. Thus, positive fixed charges are prevented.

Accordingly in the present invention, stand-by current which ruins device characteristics is prevented from increasing because breakdown voltage at the lightly doped regions beside the gate is lowered.

It will be apparent to those skilled in the art that various modifications and variations can be made in a method of fabricating a semiconductor device of the present invention without departing from the spirit or scope of the inventions. Thus, it is intended that the present invention cover the modifications and variations of this invention provided they come within the scope of the appended claims and equivalents.

What is claimed is:

1. A method of fabricating a semiconductor device comprising the steps of:
    forming a trench type field oxide layer defining an active area in a semiconductor substrate of a first conductive type;
    forming a gate in a direction of device width, wherein a gate oxide layer is between the gate and the semiconductor substrate;
    forming impurity regions in the semiconductor substrate at both sides of the gate by ion implantation of impurities of a second conductive type;
    depositing a layer of TEOS (Tetraethyl orthosilicate) covering the gate on the semiconductor substrate to form an insulating interlayer; and
    removing moisture from the TEOS (Tetraethyl orthosilicate) layer by thermal treatment.

2. The method of fabricating a semiconductor device according to claim 1, the step of forming impurity regions in the semiconductor substrate at both sides of the gate by ion implantation of impurities of a second conductive type further comprising the steps of:
    forming lightly doped regions by implanting impurity ions of the second conductive type into the semiconductor substrate using the gate as a mask;
    forming a sidewall spacer at the side of the gate; and
    forming heavily doped regions by implanting the impurity ions of the second conductive type into the semiconductor substrate using the gate and the sidewall spacer as a mask, with a dose and energy higher than that used for forming the lightly doped regions.

3. The method of fabricating a semiconductor device according to claim 1, wherein the TEOS (Tetraethyl orthosilicate) layer is formed by LPCVD (Low Pressure CVD) or PECVD (Plasma Enhanced CVD).

4. The method of fabricating a semiconductor device according to claim 3, wherein the insulating interlayer is between 6000 Å and 10000 Å thick, and is formed at a temperature between 600° C. and 700° C.

5. The method of fabricating a semiconductor device according to claim 1, wherein the insulating interlayer is treated with a vacuum annealing or a rapid thermal processing.

6. The method of fabricating a semiconductor device according to claim 5, wherein the vacuum annealing is conducted for 30 minutes to 5 hours at a temperature between 700° C. and 800° C.

7. The method of fabricating a semiconductor device according to claim 5, wherein the rapid thermal processing is conducted for 10 to 60 seconds at a temperature between 900° C. and 1000° C.

8. The method of fabricating a semiconductor device according to claim 1, further comprising the steps of:
    forming an etch-stop layer on the insulating interlayer with a material whose etch rate is different from that of the insulating interlayer; and
    forming a contact hole exposing the impurity regions by patterning the etch-stop layer and the insulating interlayer.

9. A method of fabricating a semiconductor device comprising the steps of:
    forming a trench defining an active area in a semiconductor substrate of a first conductive type;

forming a field oxide layer in the trench;

forming a gate oxide layer and a conductive layer over the gate oxide layer;

forming a gate along a direction of device width on the field oxide layer and active areas by patterning the conductive and gate oxide layers;

forming lightly doped regions by implanting impurity ions of a second conductive type into the semiconductor substrate using the gate as a mask;

forming a sidewall spacer at a side of the gate;

forming heavily doped regions by implanting the impurity ions of the second conductive type into the semiconductor substrate using the gate and sidewall spacer as a mask using a dose and energy higher than that used for forming the lightly doped regions;

depositing a layer of TEOS (Tetraethyl orthosilicate) covering the gate on the semiconductor substrate to form an insulating interlayer;

removing moisture from the TEOS (Tetraethyl orthosilicate) layer by thermal treatment;

forming an etch-stop layer on the insulating interlayer with a material whose etch rate is different than that of the insulating interlayer; and forming a contact hole exposing the impurity regions by patterning the etch-stop layer and the insulating interlayer.

10. The method of fabricating a semiconductor device according to claim 9, wherein the TEOS (Tetraethyl orthosilicate) layer is formed by LPCVD (Low Pressure CVD) or PECVD (Plasma Enhanced CVD).

11. The method of fabricating a semiconductor device according to claim 10, wherein the insulating interlayer has a thickness between 6000 Å and 10000 Å and is formed at a temperature between 600° C. and 700° C.

12. The method of fabricating a semiconductor device according to claim 9, wherein the insulating interlayer is treated with a vacuum annealing or a rapid thermal processing.

13. The method of fabricating a semiconductor device according to claim 12, wherein the vacuum annealing is conducted for 30 minutes to 5 hours at a temperature between 700° C. and 800° C.

14. The method of fabricating a semiconductor device according to claim 12, wherein the rapid thermal processing is conducted for 10 to 60 seconds at a temperature between 900° C. and 1000° C.

\* \* \* \* \*